United States Patent [19]
Thomann et al.

[11] Patent Number: 5,783,948
[45] Date of Patent: Jul. 21, 1998

[54] METHOD AND APPARATUS FOR ENHANCED BOOTING AND DC CONDITIONS

[75] Inventors: Mark R. Thomann; Paul M. Fuller, both of Boise, Id.

[73] Assignee: Micron Technology, Inc., Boise, Id.

[21] Appl. No.: 729,729

[22] Filed: Oct. 7, 1996

Related U.S. Application Data

[63] Continuation-in-part of Ser. No. 493,912, Jun. 23, 1995, Pat. No. 5,574,390.

[51] Int. Cl.[6] .................. H03K 19/01; H03K 19/094
[52] U.S. Cl. ..................... 326/88; 326/92; 326/68
[58] Field of Search ..................... 326/88, 92, 68

[56] References Cited

U.S. PATENT DOCUMENTS

| | | | |
|---|---|---|---|
| 4,751,679 | 6/1988 | Dehganpour | 365/201 |
| 5,128,560 | 7/1992 | Chern et al. | 307/475 |
| 5,128,563 | 7/1992 | Hush et al. | 307/482 |
| 5,202,587 | 4/1993 | McLaury | 307/296.2 |
| 5,245,569 | 9/1993 | Gonzalez et al. | 365/104 |
| 5,268,600 | 12/1993 | Yeu | 307/482 |
| 5,285,408 | 2/1994 | Starkweather et al. | 365/189 |
| 5,329,186 | 7/1994 | Hush et al. | 307/482 |
| 5,341,329 | 8/1994 | Takebuchi | 365/185 |
| 5,349,247 | 9/1994 | Hush et al. | 307/451 |
| 5,357,172 | 10/1994 | Lee et al. | 315/167 |
| 5,367,205 | 11/1994 | Powell | 326/27 |
| 5,369,317 | 11/1994 | Casper et al. | 326/87 |
| 5,369,320 | 11/1994 | Satani et al. | 327/108 |
| 5,390,143 | 2/1995 | Manning | 365/145 |
| 5,420,822 | 5/1995 | Kato et al. | 365/218 |
| 5,455,801 | 10/1995 | Blodgett et al. | 365/222 |
| 5,512,845 | 4/1996 | Yuh | 326/88 |
| 5,515,327 | 5/1996 | Matsukawa et al. | 365/203 |

*Primary Examiner*—Edward P. Westin
*Assistant Examiner*—Richard Roseen
*Attorney, Agent, or Firm*—Schwegman, Lundberg, Woessner & Kluth, P.A.

[57] ABSTRACT

A voltage elevation circuit supplying additional voltage for gate switching having an elevated power supply connected to a first node of a capacitor using a transistor. The elevated power supply and booting circuit providing additional voltage for gate switching applications. One application is a MOSFET output driver application having a 3 Volt power supply. One configuration using a switch to charge a capacitor using a first voltage supply and then providing additional voltage by a boot device and by switching in an elevated power supply to maintain an elevated voltage at the node.

27 Claims, 6 Drawing Sheets

METHOD AND APPARATUS FOR ENHANCED BOOTING AND DC CONDITIONS

This patent application is a continuation-in-part of U.S. patent application Ser. No. 08/493,912, filed Jun. 23, 1995, Pat. No. 5,574,390.

FIELD OF THE INVENTION

The present invention relates generally to an electronic voltage elevation system and in particular to a booting and DC conditioning system to provide adequate gate switching noise margins for low voltage electronics.

BACKGROUND OF THE INVENTION

There has been a continuing development of low power electronics for compact systems, such as portable computers, televisions, and a number of other electronic devices. Generally speaking, compact systems cannot afford large power supplies and therefore the electronics in such compact systems must be efficient and low power, so as to reduce the size of the power supplies.

There are attendant problems in creating efficient, low power electronics. For example, wasteful power dissipation can be minimized by the use of reduced power supply voltages; however, noise margins must be maintained to ensure compatibility with other circuitry and meet pre-existing specifications. Therefore, the reduction of power supply voltages incurs a compatibility issue with other standard voltage level electronics.

In particular, previous 5 Volt components are being replaced by equivalent components operating at lower source voltages. With lower operating voltages there are additional demands on driver circuits to provide adequate signal swing for maintaining proper device noise margins. This results from the fact that lower source voltage devices have less voltage to use in maintaining noise margin.

Therefore, there is a need in the art for an efficient voltage elevation method and apparatus for booting and DC conditioning to enable low voltage electronic drivers to maintain proper noise margins, despite lower operating voltages. Such a circuit should have a modest number of components to be implemented with minimal design effort.

SUMMARY OF THE INVENTION

The present disclosure describes a system for voltage elevation for enhanced booting and DC conditions in a low power, low voltage electronics. The invention is demonstrated in an output driver environment, but may be practiced in any environment where device operating voltages are less than or approximately equal to the necessary switching voltages.

In one embodiment of the present system two voltage sources are switched in conjunction with a booting device to elevate the voltage at a node. The node voltage is used to provide an elevated gate signal for switching other gates. In one application, the elevated voltage is used to ensure that an output gate provides an output voltage equal to the source supply without a threshold voltage, $V_t$, voltage drop over the output transistor. This embodiment is demonstrated in an output driver application, but may be applied to any other application where gate voltages may be elevated to enhance a switching noise margin.

In another embodiment, the elevated voltage source is switched into the system to reduce current loading of the elevated voltage source and simultaneously maintain adequate output driver voltage.

BRIEF DESCRIPTION OF THE DRAWINGS

In the drawings, where like numerals describe like components throughout the several views.

DETAILED DESCRIPTION OF THE PREFERRED EMBODIMENT

In the following detailed description of the preferred embodiment, references are made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the spirit and scope of the present invention. The following detailed description is, therefore, not to be taken in a limiting sense, and the scope of the present invention is defined by the appended claims and equivalents thereof.

Figure 1:
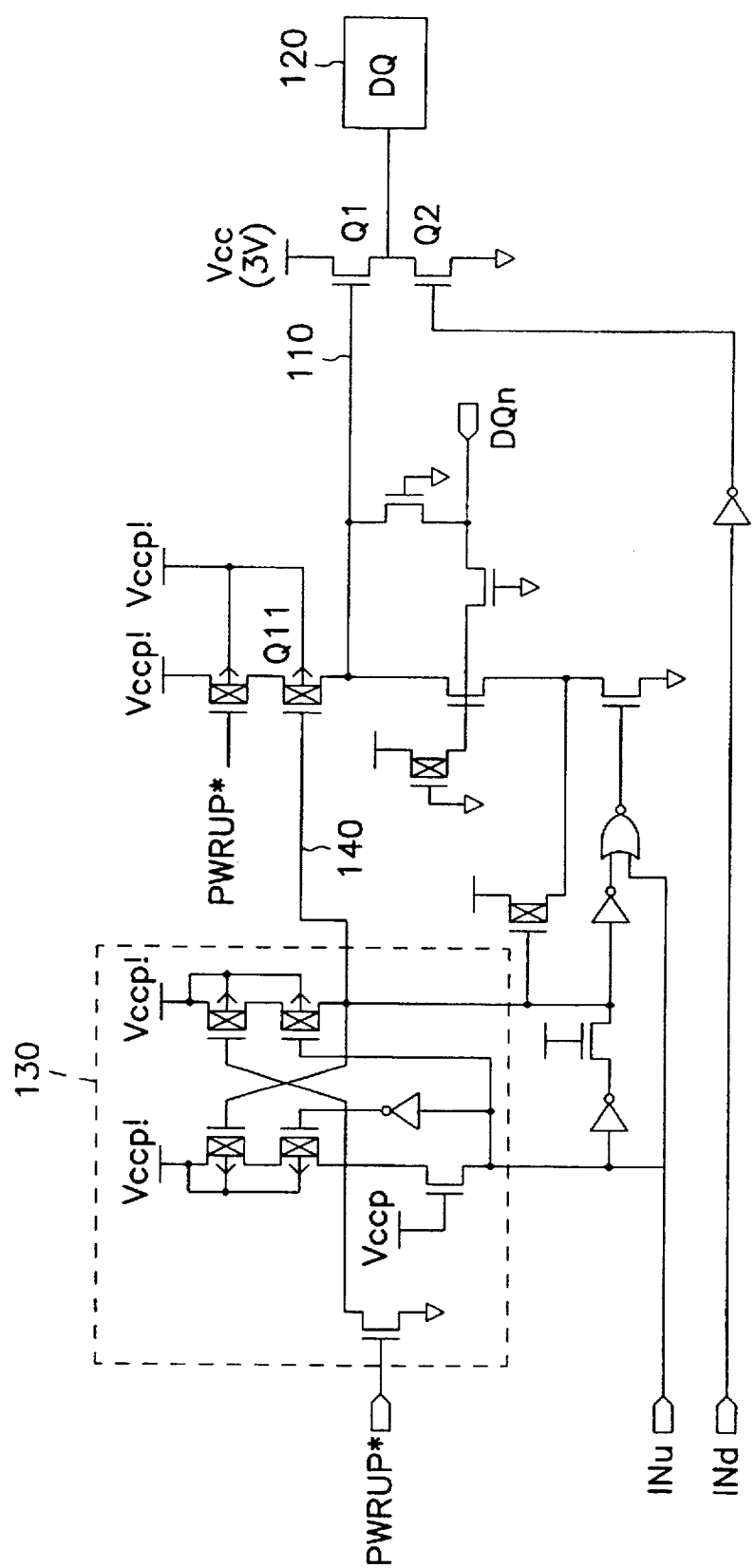
FIG. 1 is a schematic diagram of a level translator circuit, which is used to maintain a proper switching signal voltage for an output driver stage.
Figure 2:
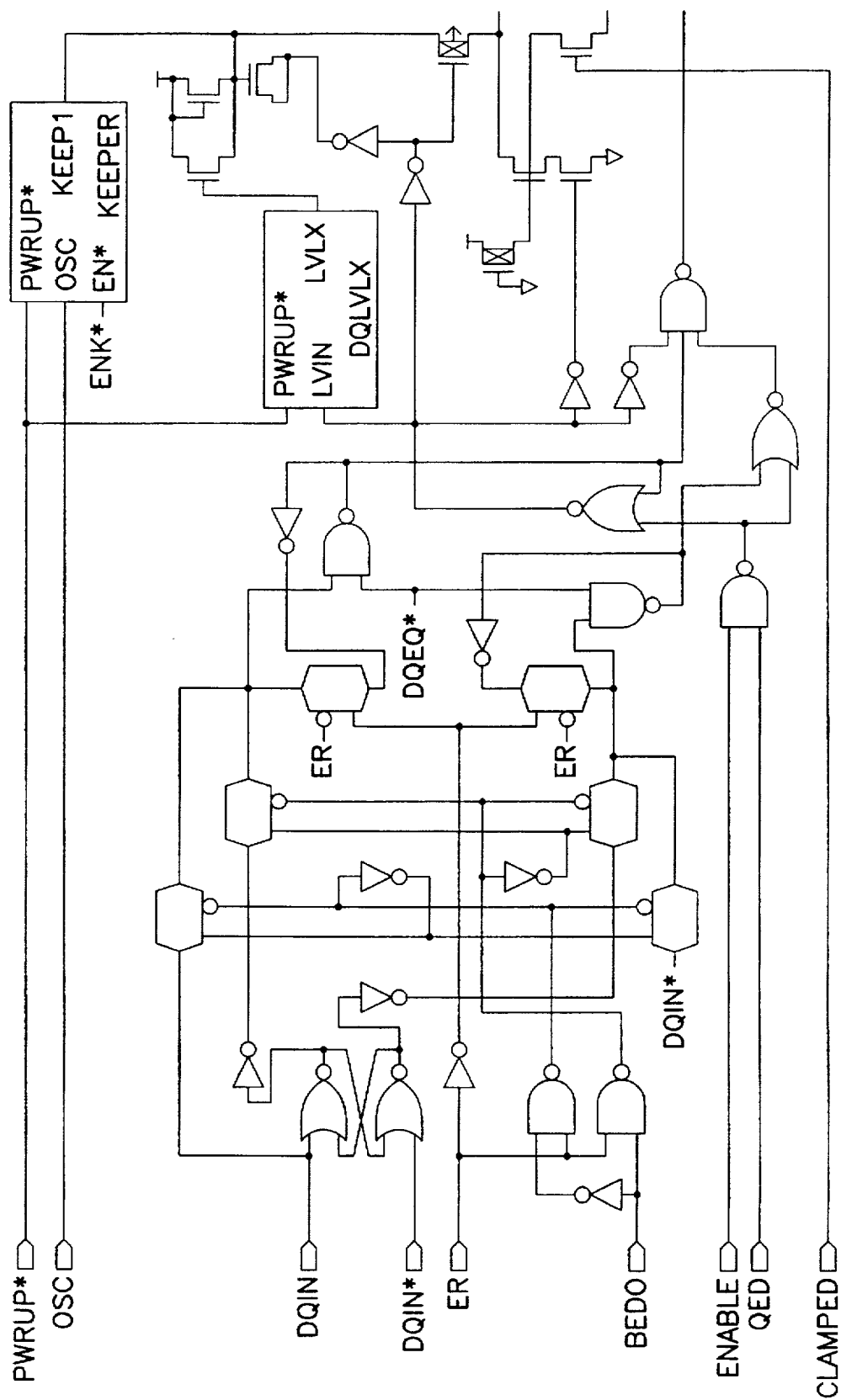
FIG. 2 is a schematic diagram of a oscillator keeper circuit, which is used to maintain a proper switching signal voltage for an output driver stage.

One environment in which the present invention may be practiced is an output driver circuit for a 3.0 Volt part. The noise margins for standard 3 volt operation are $V_{oh}$=2.4 volts and $V_{ol}$=0.8 volts. FIG. 1 shows a 3 Volt output driver circuit which provides a proper switching signal voltage to n-channel output transistors Q1 and Q2. In order to ensure that the $V_{oh}$ of 2.4 volts is reached at output node 120, the node 110 must reach a voltage of at least $V_{cc}$ plus one threshold voltage ($V_t$) drop. This is achieved in this circuit by using a boosted supply voltage of approximately 5.0 Volts ($V_{ccp1}$) to power the components in the driver in combination with a level translator 130. Level translator 130 provides an elevated voltage at node 140 for switching transistor Q11, which thereby provides a $V_{ccp1}$ switching voltage at node 110 to switch transistor Q1 on a logic level high output to pin 120. FIG. 2 shows an alternate design employing an oscillating charge pump design to elevate the voltage used for switching at node 110.

Figure 3:
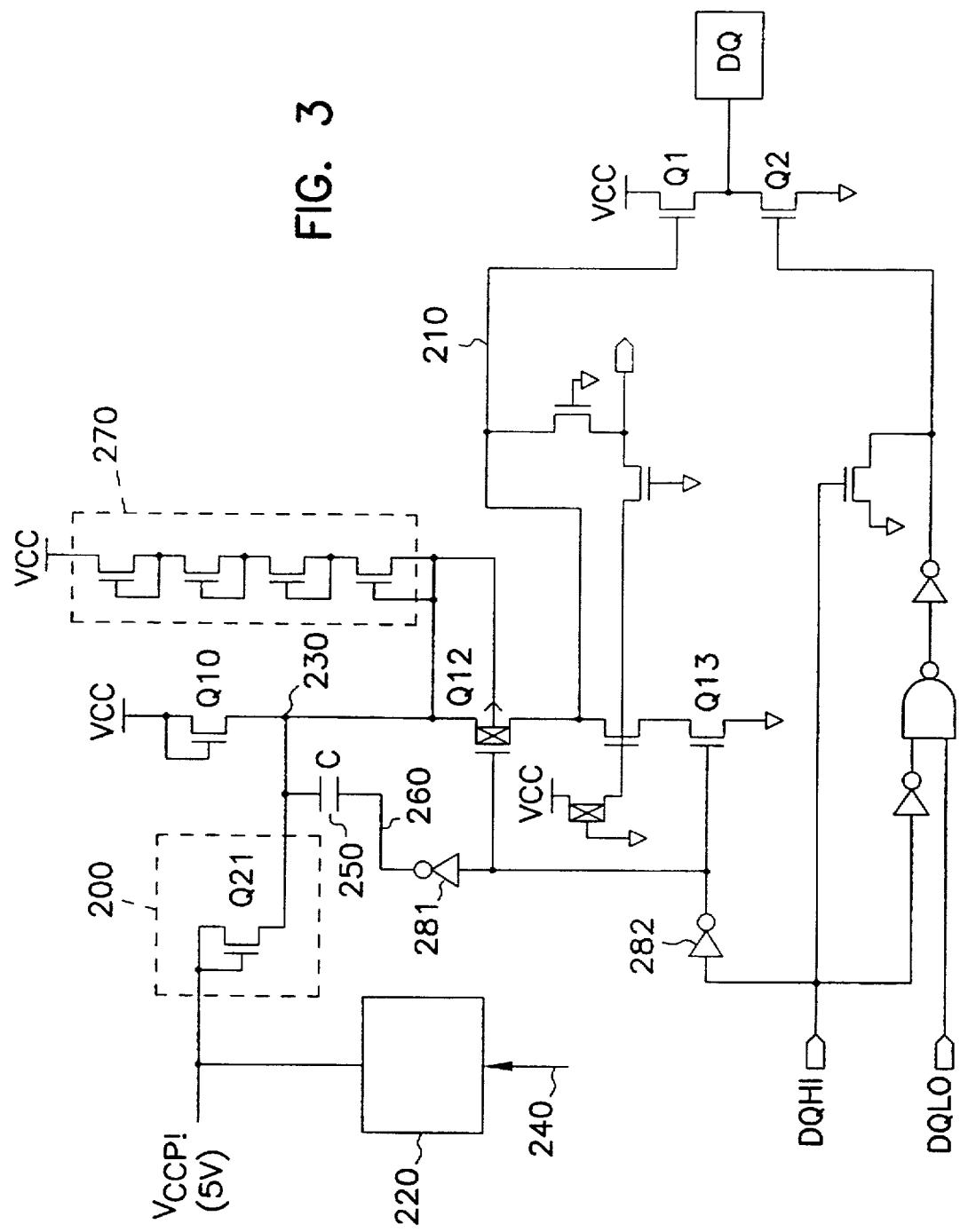
FIG. 3 is a schematic diagram of one embodiment of a voltage elevation circuit which maintains a proper switching signal voltage for an output driver stage.

One embodiment of the present invention is shown in FIG. 3, in which a single transistor, Q21, is connected to the $V_{ccp1}$ 5.0 Volt elevated supply to provide the necessary voltage at node 210 to ensure proper switching of Q1. In this embodiment, the gate and drain of Q21 are connected to $V_{ccp1}$, which is the elevated supply voltage of approximately 5 Volts from charge pump 220. The voltage at node 230 is elevated to provide an elevated voltage at node 210, which, in turn provides an elevated voltage for switching transistor Q1 within the given noise margins, given a $V_{cc}$ of 3 Volts.

In one embodiment, capacitor 250 is charged primarily by current passing through transistor Q10 to node 230 from $V_{cc}$. Since the drain and gate of Q10 are tied to $V_{cc}$, transistor Q10 is always on and the voltage at node 230 is approximately $V_{cc}$ minus $V_t$. Capacitor 250 is also charged from a charge pump 220 via transistor Q21. Therefore, capacitor 250 is pumped by the $V_{ccp!}$ supply to elevate the voltage on capacitor 250. When input DQHI is logic low, then node 260 is at approximately 0 Volts and capacitor 250 is charged to an intermediate voltage Vx, which is between $V_{cc}-V_t$ and $V_{ccp!}-V_t$ Volts. Therefore, transistor Q21 is an alternate current path 200 for charging capacitor 250 to a higher voltage than provided by voltage supply $V_{cc}$. When DQHI is forced high, then node 260 is forced to approximately $V_{cc}$ Volts by inverters 281 and 282 and a voltage of $Vx+V_{cc}$ Volts is applied to node 230. This elevated voltage is more than sufficient to raise the voltage at node 210 to greater than $V_{cc}-V_t$ volts. Inverters 281 and 282 create a boot circuit for capacitor 250. For $V_{cc}=3.0$ Volts and $V_{ccp!}=5.0$ Volts, Vx is about 4.0 Volts and the voltage at node 230, $Vx+V_{cc}$, is approximately 7.0 volts.

Figure 4:
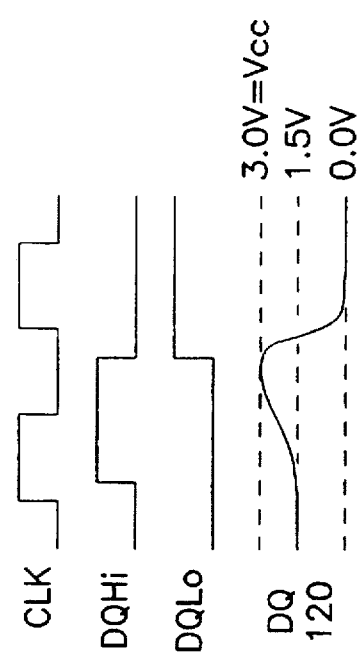
FIG. 4 is a signal timing diagram which shows the operation of the circuit of FIG. 3.

FIG. 4 illustrates the operation of the Q1 and Q2 output stage as a function of DQHI and DQLO. When DQHI and DQLO are logic zero, the output is tristated and at high impedance. When DQHI is at logic level one and DQLO is at logic level zero, transistor Q12 is active and transfers $Vx+V_{cc}$ Volts to node 210 with a single $V_t$ voltage drop, and Q1 is activated to provide a $V_{out}=V_{cc}$ Volts. Since DQLO is at logic zero, transistor Q2 is off. Diode chain 270 is used to prevent overvoltage at node 230. When DQLO is logic one and DQHI is at logic zero, the output is logic zero.

Addition of transistor Q21 is particularly important for DC conditioning, for example, in cases where node 230 must be kept elevated for an extended amount of time. For example, in the circuit of FIG. 3, Q21 provides the additional current needed to keep the capacitor 250 charged to the elevated voltage of Vx as long as the output DQ must be maintained at a logic one value. The single transistor Q21 provides additional current for capacitor 250 with substantially fewer parts than either the level translator of FIG. 1 or the oscillator keeper of FIG. 2. In addition, the output voltage does not decay due to long output times, since Q21 provides the needed current to maintain the node 230 voltage.

In one embodiment, transistor Q21 is a long channel device to ensure that current provided by charge pump 220 is limited, so as to control the loading on charge pump 220.

In an alternate embodiment, transistor Q21 is selected to provide only the current necessary to elevate the voltage of node 230. This reduces the loading on the charge pump 220. Therefore, in the example of an output driver, the majority of current used to charge capacitor 250 is obtained from transistor Q10.

In another embodiment, charge pump 220 is periodically switched to provide node 230 with an average voltage which exceeds $V_{cc}$. This reduces the loading on charge pump 220, so that it may support several other devices. An enable, such as enable 240, may be used to switch the current supplied to node 230.

Another embodiment provides controllable switching of charge pump 220 to provide extra current when the voltage at node 230 requires elevation. The circuit monitors the voltage and enables charge pump 220 as needed to maintain the voltage at node 230 at a desired level. This can be invoked either throughout the entire operation of the apparatus or alternately only for DC conditioning applications, where the node must be maintained at a specified voltage for an extended amount of time.

Figure 5:
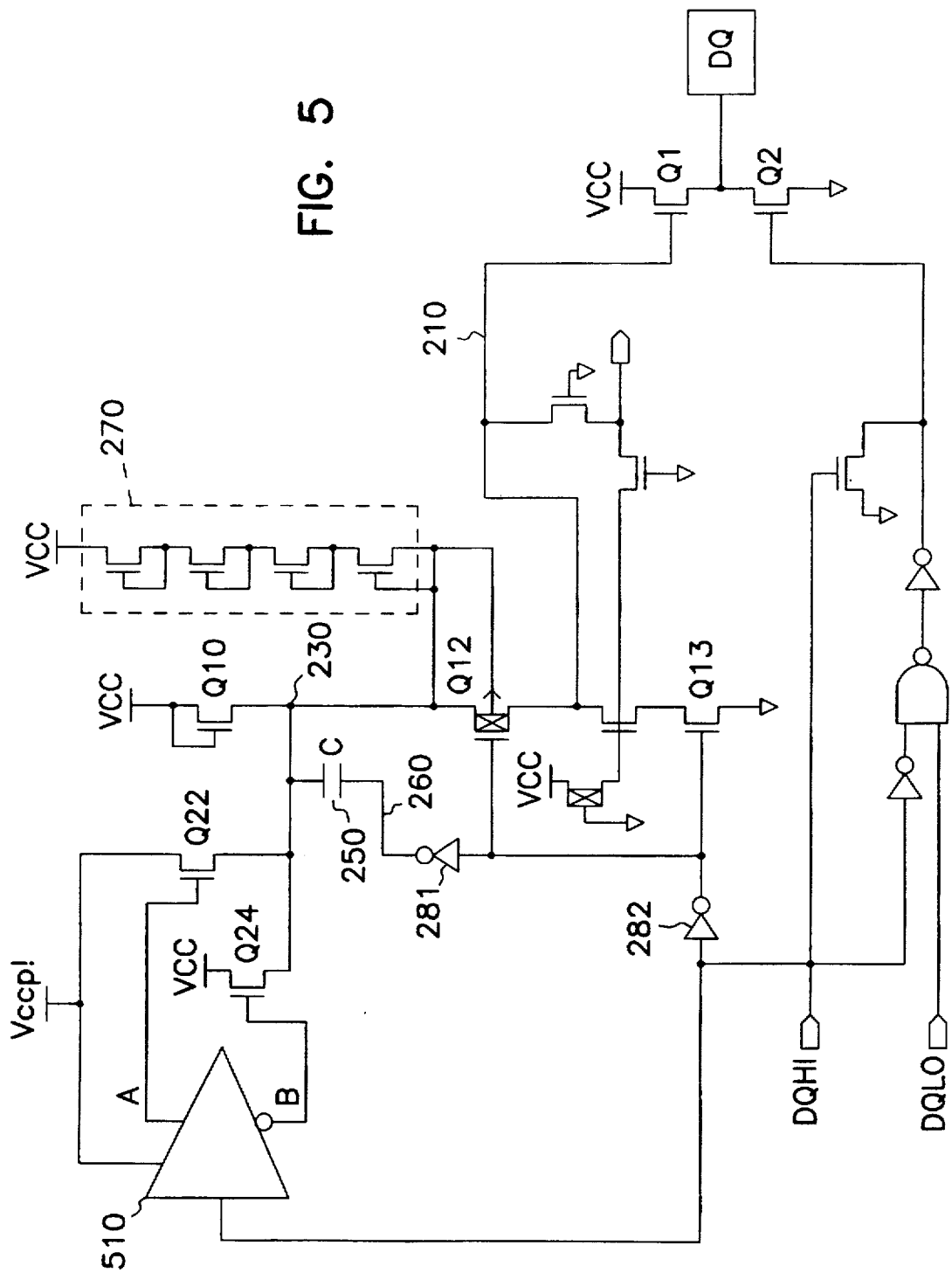
FIG. 5 is a schematic diagram of one embodiment of a voltage elevation circuit for an output driver stage.
Figure 6:
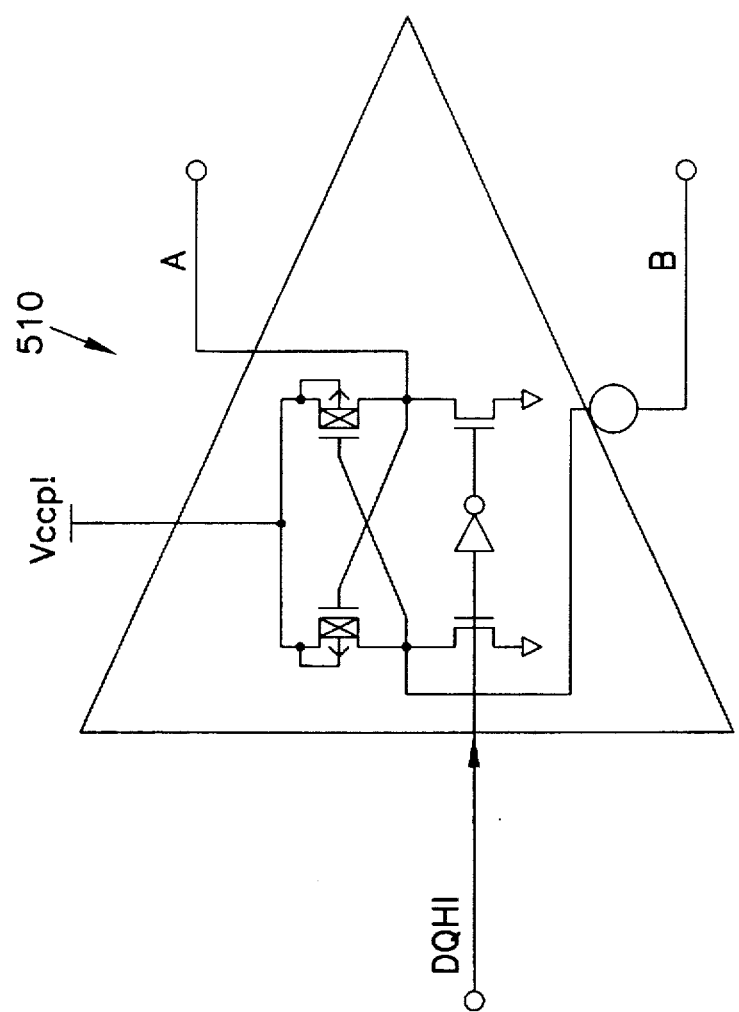
FIG. 6 is a schematic diagram of a switch for the voltage elevation circuit of FIG. 5.

FIG. 5 shows another embodiment of the present system. In this embodiment a switch 510 is added to the circuit in conjunction with transistors Q22 and Q24 to provide an elevated voltage at node 230. The switch 510 is shown in further detail in FIG. 6. In this embodiment, the switch 510 receives signal DQHI to control charging of capacitor 250 by transistors Q22 and Q24. The system first charges the capacitor 250 to a voltage substantially equal to $V_{cc}$ by switching Q24 to a conductive state and switching Q22 to a nonconductive state. Upon receipt of a DQHI signal, the system then further elevates the voltage at node 230 by switching Q24 to a nonconductive state and switching Q22 to a conductive state to charge capacitor 250 at an intermediate voltage between $V_{cc}$ and $V_{ccp!}$. The voltage at node 230 is then further elevated by booting capacitor 250 with inverters 281 and 282. Thus the current from $V_{ccp!}$ supply is used only when the DQHI signal is logic high. This ensures that the current drawn from $V_{ccp!}$ is used only when needed, to conserve the amount of current drawn from $V_{ccp!}$.

In one embodiment, capacitor 250 is precharged by a voltage of approximately $V_{cc}$. For example applying a signal from switch 510 to the gate of Q24 which exceeds the value of $V_{cc}+V_t$ provides a full $V_{cc}$ volts across capacitor 250, thereby charging node 230 to approximately $V_{cc}$ volts. At this time, Q22 is off, since the gate of Q22 is at ground, thus conserving the current drawn from $V_{ccp!}$.

After capacitor 250 is precharged to $V_{cc}$ volts, then either DQLO or DQHI is received. In the event a DQLO signal is received, the voltage across capacitor 250 is unaffected.

In the event a DQHI signal is received, the gate of Q24 is switched to a substantially nonconductive state or "off" (e.g., the gate of Q24 is at zero volts) and the gate of Q22 is switched to a conductive state or "on" (e.g., the gate of Q22 is at $V_{ccp!}$). The gate and drain of Q22 are therefore at $V_{ccp!}$ and the node 230 is maintained at a voltage elevated above $V_{cc}$ as long as $V_{ccp!}$ exceeds $V_{cc}$ by at least one threshold voltage, $V_t$. Furthermore, when the DQHI signal is received the inverters 281 and 282 switch state and the voltage at node 230 is elevated by the voltage applied to the capacitor 250.

The p-channel transistor Q12 thereby passes an elevated voltage to the gate of n-channel Q1 to ensure that the output pad DQ receives a full $V_{cc}$ volts of output voltage (in the steady state). Thus, there is no $V_t$ drop at the DQ pad. In this embodiment, current is drawn from $V_{ccp!}$ only when DQHI is asserted to conserve the loading of the $V_{ccp!}$ supply. Furthermore, capacitor 250 is precharged using a full $V_{cc}$ volts (with no $V_t$ drop), prior to receipt of a DQHI signal.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. For example, particular voltages are described in this specification, however the voltages may be increased or decreased and circuit configurations may vary without departing from the scope and spirit of the present invention. In addition, a charge pump was disclosed as providing a second voltage source; however, any number of circuits could be employed to provide a second voltage source without departing from the scope and spirit of the present invention.

Those with skill in the electrical, computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. A voltage elevation system, comprising:

a first power supply having a first output voltage;

a second power supply having a second output voltage which exceeds the first output voltage;

a capacitor having a first node and a second node, the first node connected to the first power supply through a first current path;

a boot device, connected between a common ground and the second node, the boot device supplying about zero voltage in a first state and an elevated voltage for the second node of the capacitor when in a second state; and a second current path connecting the second power supply to the first node the of the capacitor, wherein the boot device is switched to provide an elevated voltage on the first node of the capacitor.

2. The voltage elevation system of claim 1, wherein the first current path comprises a transistor.

3. The voltage elevation system of claim 1, wherein the second current path comprises a transistor.

4. The voltage elevation system of claim 1, further comprising a switch, wherein the first current path comprises a first transistor, having a first gate, the second current path comprises a second transistor having a second gate, and the switch has a first output connected to the first gate and a second output connected to the second gate.

5. The voltage elevation system of claim 4, wherein in the first state the first transistor is conductive and the second transistor is nonconductive.

6. The voltage elevation system of claim 5, wherein a gate voltage is applied to the first gate of the first transistor which exceeds the first output voltage.

7. The voltage elevation system of claim 6, wherein the gate voltage exceeds a sum of the first output voltage and a threshold voltage of the first transistor.

8. The voltage elevation system of claim 4, wherein in the second state the first transistor is nonconductive and the second transistor is conductive.

9. The voltage elevation system of claim 8, wherein a gate voltage is applied to the second gate of the second transistor which exceeds the first output voltage.

10. The voltage elevation system of claim 1, wherein the boot device comprises an inverter.

11. A voltage elevation system, comprising:

a first power supply having a first output voltage;

a second power supply having a second output voltage which exceeds the first output voltage;

a capacitor having a first node and a second node, the first node connected to the first power supply through a first current path, the first current path including a first transistor having a first gate;

a boot device, connected between a common ground and the second node, the boot device supplying about zero voltage in a first state and an elevated voltage for the second node of the capacitor when in a second state; and a second current path connecting the second power supply to the first node the of the capacitor, the second current path including a second transistor having a second gate;

wherein the boot device is switched to provide an elevated voltage on the first node of the capacitor.

12. The voltage elevation system of claim 11, wherein the boot device comprises an inverter.

13. The voltage elevation system of claim 11, wherein in the first state the first transistor is conductive and the second transistor is nonconductive and in the second state the first transistor is nonconductive and the second transistor is conductive.

14. The voltage elevation system of claim 13, wherein in the first state a gate voltage is applied to the first gate which exceeds the first output voltage.

15. The voltage elevation system of claim 14, wherein the gate voltage exceeds a sum of the first output voltage and a threshold voltage of the first transistor.

16. The voltage elevation system of claim 15, wherein in the second state a gate voltage is applied to the second gate of the second transistor which exceeds the first output voltage.

17. The voltage elevation system of claim 11, wherein in the first state the first transistor is conductive and the second transistor is nonconductive to charge the capacitor with a voltage substantially equal to the first output voltage and in the second state the first transistor is nonconductive and the second transistor is conductive to charge the capacitor with a voltage above the first output voltage.

18. The voltage elevation system of claim 17, wherein the boot device is an inverter which is switched state after charging the capacitor in the second state to further elevate the voltage on the first node of the capacitor.

19. A voltage elevation system, comprising:

a first power supply having a first output voltage;

a second power supply having a second output voltage which exceeds the first output voltage;

a capacitor having a first node and a second node, the first node connected to the first power supply through a first current path, the first current path including a first transistor having a first gate;

a boot device, connected between a common ground and the second node, the boot device supplying about zero voltage in a first boot state and an elevated voltage for the second node of the capacitor when in a second boot state; and a second current path connecting the second power supply to the first node the of the capacitor, the second current path including a second transistor having a second gate;

wherein in a first state the first transistor is conductive and the second transistor is nonconductive to charge the capacitor with a voltage substantially equal to the first output voltage and in a second state the first transistor is nonconductive and the second transistor is conductive to charge the capacitor with a voltage above the first output voltage.

20. The voltage elevation system of claim 19, wherein in the first state a gate voltage is applied to the first gate which exceeds the first output voltage.

21. The voltage elevation system of claim 20, wherein the gate voltage exceeds a sum of the first output voltage and a threshold voltage of the first transistor.

22. The voltage elevation system of claim 19, wherein in the second state a gate voltage is applied to the second gate of the second transistor which exceeds the first output voltage.

23. The voltage elevation system of claim 19, wherein the boot device comprises an inverter which is switched state after charging the capacitor in the second state to further elevate the voltage on the first node of the capacitor.

24. A method for voltage elevation, comprising the steps of:

charging a capacitor with a first supply voltage through a first current path connected to a first node of the capacitor;

charging the capacitor with a second supply voltage through a second current path connected to the first node of the capacitor, wherein a magnitude of the second supply voltage exceeds a magnitude of the second supply voltage; and applying a voltage to a second node of the capacitor to further elevate a voltage at the first node of the capacitor.

25. The method of claim 24, wherein the voltage at the first node of the capacitor is used to provide a switching voltage which exceeds a sum of the first supply voltage and a threshold voltage of an output transistor.

26. The method of claim 24, wherein the first current path includes a transistor which is switched using a gate voltage which exceeds the first supply voltage.

27. The method of claim 24, wherein the second current path includes a transistor which is switched using a gate voltage which exceeds the first supply voltage.

* * * * *